(12) United States Patent
Lin et al.

(10) Patent No.: US 6,281,114 B1
(45) Date of Patent: Aug. 28, 2001

(54) PLANARIZATION AFTER METAL CHEMICAL MECHANICAL POLISHING IN SEMICONDUCTOR WAFER FABRICATION

(75) Inventors: Chenting Lin, Poughkeepsie; Larry Clevenger, LaGrangeville, both of NY (US); Ranier Florian Schnabel, Munich (DE)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/498,873

(22) Filed: Feb. 7, 2000

(51) Int. Cl.$^7$ .................................................. H01L 21/302
(52) U.S. Cl. .......................... 438/633; 438/692; 438/742
(58) Field of Search .................................... 438/626, 633, 438/645, 692, 742, FOR 355

(56) References Cited

U.S. PATENT DOCUMENTS

| | | | |
|---|---|---|---|
| 5,494,854 | * | 2/1996 | Jain . |
| 5,851,899 | * | 12/1998 | Weigand . |
| 5,926,713 | * | 7/1999 | Hause et al. . |
| 5,952,241 | * | 9/1999 | Baker et al. . |
| 6,045,435 | * | 4/2000 | Bajaj et al. . |
| 6,080,659 | * | 6/2000 | Chen et al. . |
| 6,083,838 | * | 7/2000 | Burton et al. . |
| 6,093,631 | * | 7/2000 | Jaso et al. . |
| 6,093,651 | * | 7/2000 | Andideh et al. . |

FOREIGN PATENT DOCUMENTS

| | | | |
|---|---|---|---|
| 0359109 A1 | * | 3/1990 | (EP) . |
| 0608628 A2 | * | 8/1994 | (EP) . |
| 2202673A | * | 9/1988 | (GB) . |
| 2212979 A | * | 2/1989 | (GB) . |

* cited by examiner

Primary Examiner—George Fourson
Assistant Examiner—Joannie Adelle Garcia
(74) Attorney, Agent, or Firm—Stanton C. Braden

(57) ABSTRACT

A process is provided for planarization of an insulation layer, e.g., of silicon dioxide, on a semiconductor wafer, e.g., of silicon, and having a surface with a downwardly stepped chemically mechanically polished arrangement of metal lines in the insulation layer between intervening insulation portions. A first pattern portion of metal lines is separated by intervening insulation portions and defines a first pattern factor having a first value, and an adjacent second pattern portion of metal lines is separated by intervening insulation portions and defines a second pattern factor having a second value different from the first value. The second pattern portion is at a step depth relative to the insulation layer surface different from that of the first pattern portion relative to such layer surface. The process involves chemically mechanically polishing the insulation layer surface and first and second pattern portions to reduce the step depths of the pattern portions relative to the insulation layer surface and to each other, for planarizing the insulation layer surface and pattern portions relative to each other. The process further involves providing a further insulation layer on the planarized insulation layer, and a further arrangement of metal lines in the further insulation layer, and chemically mechanically polishing the further arrangement of metal lines.

17 Claims, 6 Drawing Sheets

PLANARIZATION AFTER METAL CHEMICAL MECHANICAL POLISHING IN SEMICONDUCTOR WAFER FABRICATION

FIELD OF INVENTION

This invention relates to planarization after metal chemical mechanical polishing (CMP) in semiconductor wafer fabrication, and more particularly to a process for post-metal CMP planarization to reduce topography (i.e., surface configuration or relief feature) differences between an insulation layer and individual metal line pattern portions therein having differing pattern factors, in a multilayer, e.g., dual damascene, arrangement of a semiconductor wafer, as well as to the semiconductor wafer thereby produced.

As used herein, "semiconductor wafer" means any microelectronic device, substrate, chip or the like, e.g., of silicon, used to provide an integrated circuit or other related circuitry structure; "topography" means the height difference between the top surface of an insulation layer and the top surface of a metal line pattern portion therein, and/or between the top surfaces of adjacent metal line pattern portions therein; and "pattern factor" means the proportion of the total area, defined by the metal lines and intervening portions of the insulation layer which comprise the pattern portion, that is occupied by the metal lines alone.

BACKGROUND OF THE INVENTION

In fabricating microelectronic semiconductor devices and the like on a semiconductor wafer (substrate or chip), e.g., of silicon, to form an integrated circuit (IC), etc., various metal layers and insulation layers are deposited in selective sequence, and in some cases oxide layers are grown in situ on the wafer. To maximize integration of device components in the available wafer area to fit more components in the same area, increased IC miniaturization is utilized. Reduced pitch dimensions are needed for denser packing of components per present day very large scale integration (VLSI), e.g., at sub-micron (below 1 micron, i.e., 1,000 nanometer or 10,000 angstrom) dimensions.

A typical conventional technique for forming a patterned conductive multilayer, e.g., dual damascene (i.e., inlaid), arrangement on a semiconductor wafer, e.g., of silicon, involves the deposition thereon of successive levels of alternating insulation layers, e.g., of silicon dioxide, and metal layers, e.g., of aluminum, copper or tungsten, with appropriate photolithographic patterning and then etching, to provide successive level conductive metal lines in the associated insulation layers.

As to the steps for providing the lowest or first level conductive metal line arrangement, (1) a first level insulation layer is deposited on the semiconductor wafer and subjected to photolithographic patterning and then etching to form an arrangement of first level trenches therein; (2) a first level metal layer is deposited on the first level insulation layer to fill the first level trenches; and (3) the first level metal layer is subjected to metal chemical mechanical polishing (CMP) to form an arrangement of first level metal lines in the first level trenches between intervening insulation layer portions while removing the remainder of the first level metal layer to prevent touching and thus short circuiting between adjacent first level metal lines.

As to the steps for providing the next higher or second level conductive metal line arrangement, (4) a second level insulation layer is deposited on the first level insulation layer to cover the first level arrangement of metal lines; (5) the second level insulation layer is subjected to photolithographic patterning and then etching to form an arrangement of second level trenches therein; (6) a second level metal layer is deposited on the second level insulation layer to fill the second level trenches; and (7) the second level metal layer is subjected to metal CMP to form an arrangement of second level metal lines in the second level trenches between intervening insulation layer portions while removing the remainder of the second level metal layer to prevent touching and short circuiting between adjacent second level metal lines.

As to the providing of the next higher or third level, e.g., triple damascene, conductive metal line arrangement, if any, the above steps (4) to (7) are repeated to form such further level conductive metal line arrangement. The arrangements of metal lines in the multilayer arrangement are interconnected by metallization through vias or small holes or apertures (windows) etched in the intervening insulation layers in known manner. The semiconductor wafer is then further processed to provide the final wafer product.

One problem is that metal CMP introduces topography into the semiconductor wafer due to dishing and erosion of metal line regions. This topography is transferred conformally to higher levels of the multilayer arrangement, leading to smaller process windows for subsequent pressing and in general also to larger yield losses for the final wafer product.

Higher pattern factor metal lines erode more than lower pattern factor metal lines during metal CMP since a given area higher pattern factor metal line region contains more metal and less trench-forming intervening insulation layer material than a like area lower pattern factor metal line region. The metal is readily selectively removed by the metal CMP, e.g., using an aqueous colloidal alumina abrasive slurry in conventional manner. On the other hand, as the slurry is designed to remove metal and not insulation layer material, the latter is not significantly removed yet is eroded to a minor extent by the metal CMP.

Moreover, during metal CMP of a lower level metal layer, variations in pattern factors in the arrangement of metal lines lead to non-uniform dishing of the metal lines and erosion of the surrounding or intervening areas of the insulation layer. This also introduces topography into the semiconductor wafer.

It is desirable to have a process which offsets such non-uniform dishing of the lower level metal lines and erosion of surrounding or intervening insulation layer areas, which reduces such topography, which is low in cost, and in particular which reduces topography height differences between intervening insulation layer areas and metal lines, and which also reduces topography differences between metal lines with different pattern factors in the same lower level metal line arrangement. This would provide a more planar (flatter) layer arrangement permitting wider (larger) process windows and higher yield processing at subsequent (higher) levels of the multilayer arrangement.

SUMMARY OF THE INVENTION

The foregoing drawbacks are obviated in accordance with the present invention by providing a process which offsets such non-uniform dishing of the lower level metal lines and erosion of surrounding or intervening insulation layer areas, which reduces such topography, and which is low in cost. In particular, the process of the invention reduces topography height differences between intervening insulation layer areas and metal lines, and also reduces topography differences between metal lines with different pattern factors in the same lower level metal line arrangement. The process of the invention thereby provides a more planar (flatter) layer arrangement which permits wider (larger) process windows and higher yield processing at subsequent (higher) levels of the multilayer arrangement.

In accordance with the present invention, a process is provided for planarization of an insulation layer disposed on a semiconductor wafer and having a surface containing a downwardly stepped chemically mechanically polished arrangement of metal lines in corresponding trenches defined in the insulation layer between intervening insulation portions.

The arrangement of metal lines includes a first pattern portion of metal lines separated by intervening insulation portions and defining a first pattern factor having a first value, and an adjacent second pattern portion of metal lines separated by intervening insulation portions and defining a second pattern factor having a second value different from the first value. The second pattern portion is located at a step depth relative to the insulation layer surface different from the step depth of the first pattern portion relative to such layer surface.

The process comprises chemically mechanically polishing the insulation layer surface and first and second pattern portions sufficiently to reduce the step depths of the first and second pattern portions relative to the insulation layer surface and relative to each other, for planarization of such layer surface and first and second pattern portions relative to each other.

For instance, the first pattern factor value may be about 80–90% and the second pattern factor value may be about 60–70%.

The process further comprises depositing a further insulation layer on the resulting planarized insulation layer surface and first and second pattern portions, providing a further arrangement of metal lines in corresponding trenches in the further insulation layer, and chemically mechanically polishing the further arrangement of metal lines.

Typically, the wafer comprises silicon, the first-mentioned insulation layer and further insulation layer comprise silicon dioxide, and the metal lines individually comprise aluminum, copper or tungsten.

According to a preferred embodiment, the arrangement of metal lines includes a first pattern portion of metal lines separated by intervening insulation portions and defining a first pattern factor having a first value, an adjacent second pattern portion of metal lines separated by intervening insulation portions and defining a second pattern factor having a second value different from the first value, and an adjacent third pattern portion of metal lines separated by intervening insulation portions and defining a third pattern factor having a third value different from the first and second values. The second pattern portion is located at a step depth relative to the insulation layer surface different from that of the first pattern portion relative to such layer surface, and the third pattern portion is located at a step depth relative to such layer surface different from the step depths of the first and second pattern portions relative to such layer surface.

The process comprises chemically mechanically polishing the insulation layer surface and first, second and third pattern portions sufficiently to reduce the step depths of the first, second and third pattern portions relative to the insulation layer surface and relative to each other, for planarization of such layer surface and first, second and third pattern portions relative to each other. Typically, the first pattern factor value is about 80–90%, the second pattern factor value is about 60–70%, and the third pattern factor value is about 40–60%.

In particular, before the insulation layer chemical mechanical polishing (CMP), the step depth of the first pattern portion relative to the insulation layer surface is about 125–250 nm, that of the second pattern portion relative to such layer surface is about 100–200 nm, and that of the third pattern portion relative to such layer surface is about 25–75 nm. After the insulation layer CMP, the step depth of the first pattern portion relative to such layer surface is about 50–75 nm, that of the second pattern portion relative to such layer surface is about 40–90 nm, and that of the third pattern portion relative to such layer surface is about 10–25 nm.

Advantageously, the process further comprises depositing a further insulation layer on the resulting planarized insulation layer surface and first, second and third pattern portions, providing a further arrangement of metal lines in corresponding trenches in the further insulation layer, and chemically mechanically polishing the further arrangement of metal lines.

The present invention also contemplates the product produced by the above described process.

The invention will be more readily understood from the following detailed description taken with the accompanying drawings and claims.

Figure 4A:
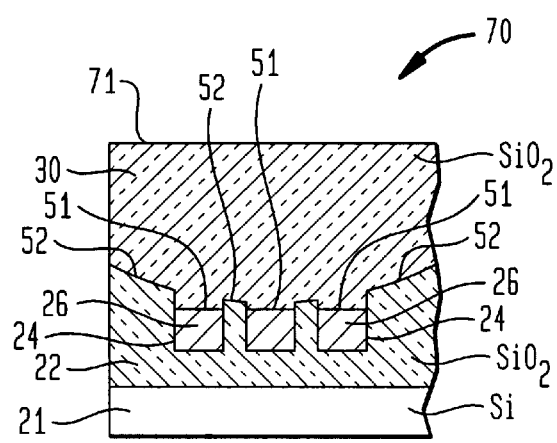
FIGS. 4A to 4B are a series of vertical sectional views, like FIGS. 3A to 3C, but showing stages in forming an actual high pattern factor patterned conductive multilayer arrangement on a semiconductor wafer per a typical conventional technique, starting from the stage shown in FIG. 3B to avoid the result shown in the stage of FIG. 3C.

of three pattern portions extending along the width in microns (abscissa), of the upper insulation layer of an actual semiconductor wafer produced per the typical conventional technique shown in FIG. 4A.

It is noted that the drawings are not to scale, some portions being shown exaggerated to make the drawings easier to understand.

DETAILED DESCRIPTION

Referring now to FIGS. 1A to 1D, a series of vertical sectional views is shown of stages in forming an idealized low pattern factor patterned conductive multilayer, e.g., dual damascene, arrangement, per above noted steps (1) to (7), on a semiconductor wafer, designated wafer arrangement 20 and having a base layer 21, an insulation layer 22, a surface 23, a trench 24, a metal layer 25, a metal line 26, surfaces 27, 28 and 29, an insulation layer 30, a trench 31, a metal line 32, and surfaces 33 and 34.

Figure 1A:
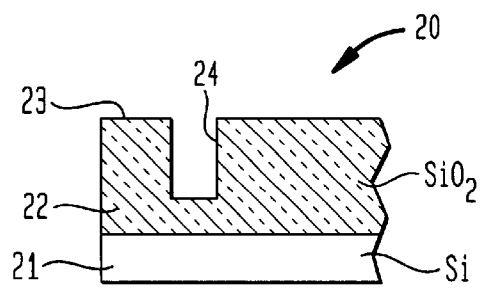
FIGS. 1A to 1D are a series of vertical sectional views showing stages in forming an idealized low pattern factor patterned conductive multilayer arrangement on a semiconductor wafer.

As shown in FIG. 1A, wafer arrangement 20 includes a base layer 21, e.g., of silicon, on which a lower (first level) conductive metal line arrangement is to be provided. Initially, a lower insulation layer 22, e.g., of silicon dioxide, is deposited, e.g., by plasma enhanced chemical vapor deposition (PECVD), on base layer 21, followed by photolithographic patterning and then etching of lower insulation layer 22 to form a low pattern factor arrangement of lower trenches, represented symbolically by one trench 24, in its top surface 23 (step 1).

Figure 1B:
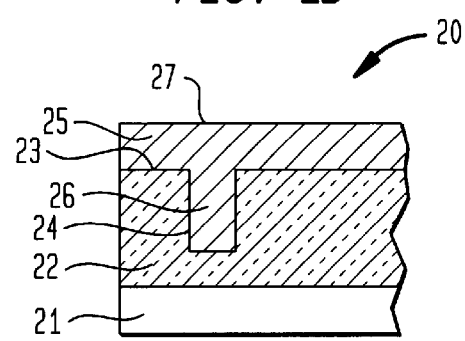

As shown in FIG. 1B, a lower metal layer 25, e.g., of aluminum, copper or tungsten, is deposited, e.g., by PECVD, on top surface 23 of lower insulation layer 22 to fill the low pattern factor lower trench 24 and form therein a corresponding low pattern factor arrangement of lower metal lines, represented symbolically by one metal line 26, but still contiguous with lower metal layer 25 below its top surface 27 (step 2).

Figure 1C:
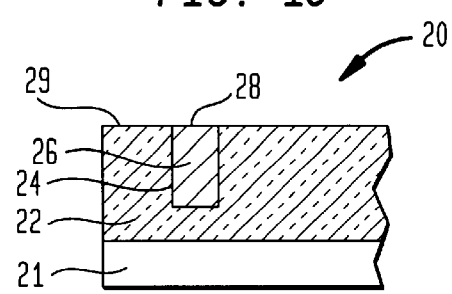

As shown in FIG. 1C, lower metal layer 25 is subjected to metal chemical mechanical polishing (CMP) to remove such metal layer and form a polished top surface 28 on lower metal line 26 and a polished top surface 29 on lower insulation layer 22, with the latter containing a low pattern factor arrangement of individual lower metal lines, represented symbolically by one metal line 26, in low pattern factor lower trenches, represented symbolically by one trench 24, i.e., between intervening portions of lower insulation layer 22. In this metal CMP step, all of lower metal layer 25 is removed to prevent short circuiting between adjacent lower metal lines, whereby to form a lower (first level) conductive metal line arrangement (step 3).

Figure 1D:
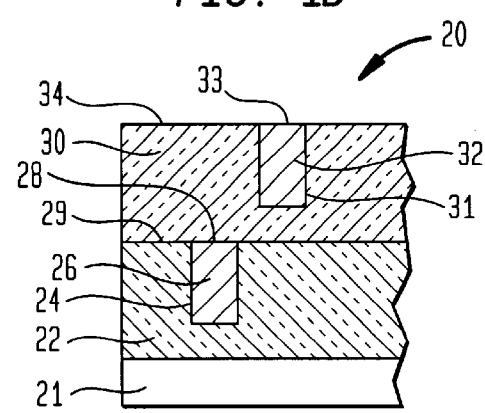

As shown in FIG. 1D, the next higher or upper (second level) conductive metal line arrangement is provided by depositing an upper insulation layer 30, e.g., of silicon dioxide, e.g., by PECVD, on top surface 29 of lower insulation layer 22 to cover the low pattern factor arrangement of lower metal lines, represented symbolically by one metal line 26 (step 4); subjecting upper insulation layer 30 to photolithographic patterning and then etching to form a low pattern factor arrangement of upper trenches therein, represented symbolically by one trench 31 (step 5); depositing an upper metal layer (not shown), e.g., of aluminum, copper or tungsten, e.g., by PECVD, on upper insulation layer 30 to fill the low pattern factor trench 31 and form a corresponding low pattern factor arrangement of upper metal lines, represented symbolically by one metal line 32 (step 6); and subjecting the upper metal layer to metal CMP to remove such metal layer and form a polished top surface 33 on upper metal line 32 and a polished top surface 34 on upper insulation layer 30 (step 7).

Accordingly, upper insulation layer 30 contains a low pattern factor arrangement of individual upper metal lines, represented symbolically by one metal line 32, in low pattern factor upper trenches, represented symbolically by one trench 31, i.e., between intervening portions of upper insulation layer 30, such that all of the upper metal layer is removed to prevent short circuiting between adjacent upper metal lines.

As to the next higher or third level, e.g., triple damascene, conductive metal line arrangement, if any, in wafer arrangement 20, steps (4) to (7) are repeated to form the further level conductive metal line arrangement. The arrangements of metal lines in this multilayer arrangement are interconnected by metallization through windows (not shown) etched in the intervening insulation layers in known manner. The semiconductor wafer is then processed to produce the final wafer product.

Referring now to FIGS. 2A to 2D, a series of vertical sectional views, like FIGS. 1A to 1D, is shown of stages in forming an idealized high pattern factor patterned conductive multilayer, e.g., dual damascene, arrangement, per said steps (1) to (7), on a semiconductor wafer, designated wafer arrangement 40, with the same parts 21-34 as in FIGS. 1A to 1D. The only difference is that in FIGS. 2A to 2D the high pattern factor lower metal line arrangement is represented symbolically by three lower trenches 24 and three lower metal lines 26, and the high pattern factor upper metal line arrangement is represented symbolically by two upper trenches 31 and two upper metal lines 32.

Figure 2A:
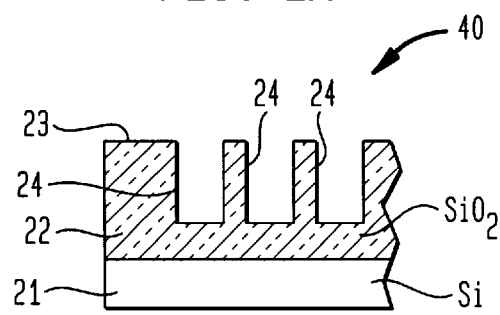
FIGS. 2A to 2D are a series of vertical sectional views, like FIGS. 1A to 1D, but showing stages in forming an idealized high pattern factor patterned conductive multilayer arrangement on a semiconductor wafer.

In the same manner as in FIG. 1A, FIG. 2A shows wafer arrangement 40 as having a base layer 21 on which a lower conductive metal line arrangement is provided. Lower insulation layer 22 is deposited on base layer 21, followed by its photolithographic patterning and then etching to form a high pattern factor lower arrangement of trenches 24 in its top surface 23 (step 1).

Figure 2B:
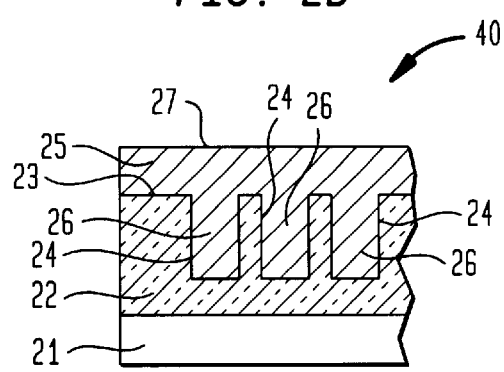

In the same manner as in FIG. 1B, FIG. 2B shows the depositing of lower metal layer 25 on top surface 23 of lower insulation layer 22 to fill high pattern factor lower trenches 24 and form therein a corresponding high pattern factor lower arrangement of metal lines 26 still contiguous with lower metal layer 25 below its top surface 27 (step 2).

Figure 2C:
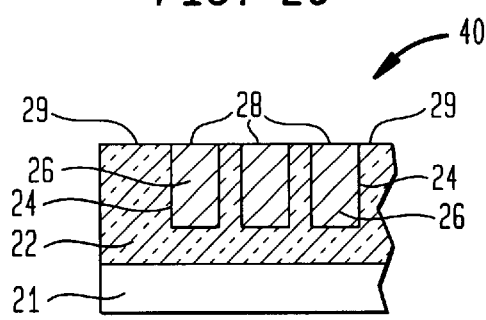

In the same manner as in FIG. 1C, FIG. 2C shows the subjecting of lower metal layer 25 to metal CMP to remove such metal layer and form a polished top surface 28 on lower metal lines 26 and a polished top surface 29 on lower insulation layer 22, with the latter containing a high pattern factor lower arrangement of individual metal lines 26, in high pattern factor lower trenches 24, i.e., between intervening portions of lower insulation layer 22. In this metal CMP step, all of lower metal layer 25 is removed to prevent short circuiting between adjacent lower metal lines, whereby to form a lower (first level) conductive metal line arrangement (step 3).

Figure 2D:
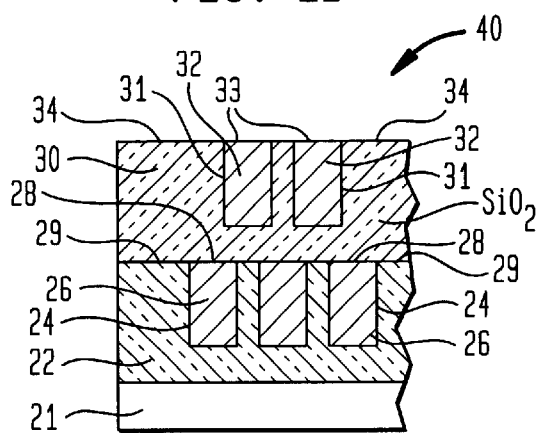

In the same manner as in FIG. 1D, FIG. 2D shows the providing of the next higher or upper (second level) conductive metal line arrangement by depositing upper insulation layer 30 on top surface 29 of lower insulation layer 22 to cover the high pattern factor lower arrangement of metal lines 26 (step 4); subjecting upper insulation layer 30 to photolithographic patterning and then etching to form a high pattern factor upper arrangement of trenches 31 therein (step 5); depositing an upper metal layer (not shown) on upper insulation layer 30 to fill high pattern factor upper trenches 31 and form a corresponding high pattern factor upper arrangement of metal lines 32 (step 6); and subjecting the upper metal layer to metal CMP to remove such metal layer and form a polished top surface 33 on upper metal lines 32 and a polished top surface 34 on upper insulation layer 30 (step 7).

Accordingly, upper insulation layer 30 contains a high pattern factor upper arrangement of individual metal lines 32 in high pattern factor upper trenches 31, i.e., between intervening portions of upper insulation layer 30, such that all of the upper metal layer is removed to prevent short circuiting between adjacent upper metal lines.

As to the next higher or third level, e.g., triple damascene, conductive metal line arrangement, if any, in wafer arrangement 40, said steps (4) to (7) are repeated to form the further level conductive metal line arrangement. The arrangements of metal lines in this multilayer arrangement are interconnected by metallization through windows (not shown) etched in the intervening insulation layers in known manner. The semiconductor wafer is then processed to produce the final wafer product.

As noted above, FIGS. 1A to 1D and FIGS. 2A to 2D depict idealized metal CMP of the lower metal layer on the lower insulation layer, without dishing or erosion of the lower arrangement of metal lines and associated trench-defining intervening insulation layer portions, and permitting the next higher level to be properly provided, i.e., in the form of a flat upper insulation layer deposited on the lower insulation layer and containing an arrangement of upper trenches, and on which an upper metal layer is in turn deposited and subjected to metal CMP to form an upper arrangement of metal lines in associated trenches.

However, in actual practice, metal CMP introduces topography into the semiconductor wafer due to dishing and erosion of metal line regions, with higher pattern factor metal lines eroding more than lower pattern factor metal lines. This is because a given area higher pattern factor metal line region contains more metal and less trench-forming intervening insulation layer material than a like area lower pattern factor metal line region.

For example, an 80% pattern factor metal line region of 100 nm$^2$ total area has 80 nm$^2$ of metal area and 20 nm$^2$ of trench-forming intervening insulation layer material area, whereas a 60% pattern factor metal line region of like total area has 60 nm$^2$ of metal area and 40 nm$^2$ of trench-forming intervening insulation layer material area. Hence, during metal CMP the higher (80%) pattern factor metal line region is removed to a greater extent than the lower (60%) pattern factor metal line region.

Figure 3A:
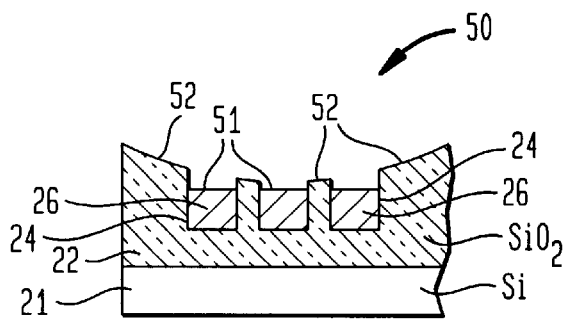
FIGS. 3A to 3C are a series of vertical sectional views, like FIGS. 2C to 2D, but showing stages in forming an actual high pattern factor patterned conductive multilayer arrangement on a semiconductor wafer per the prior art.
Figure 3B:
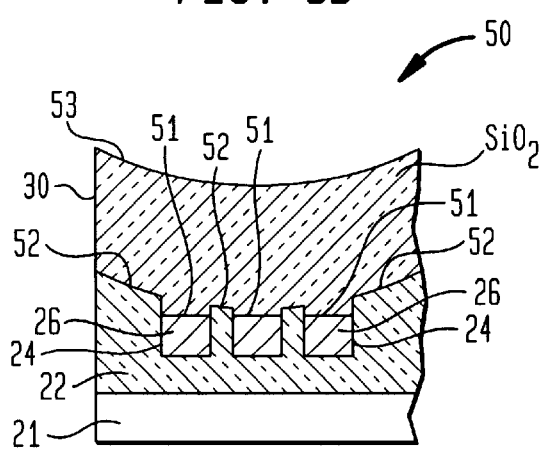
Figure 3C:
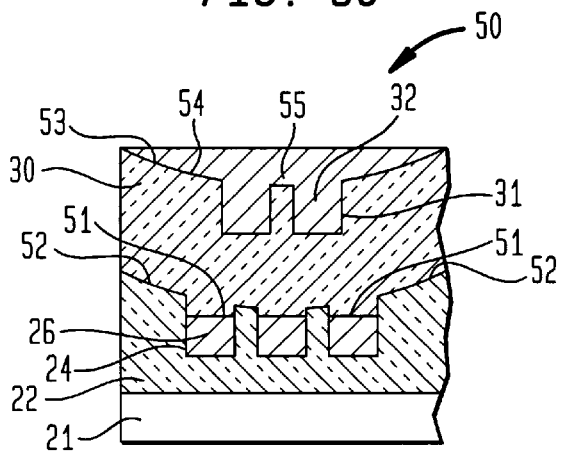

Referring now to FIGS. 3A to 3C, a series of vertical sectional views, like FIGS. 2C to 2D, is shown of stages in forming an actual high pattern factor patterned conductive multilayer, e.g., dual damascene, arrangement, per said steps (1) to (7), on a semiconductor wafer per the prior art, designated wafer arrangement 50. Wafer arrangement 50 has, per FIGS. 3A to 3C, the same parts 21–22, 24, 26 and 30–32 as in FIGS. 2C to 2D, plus parts 51–53 which are analogous to parts 28–29 and 34, and added parts 54–55. Specifically, wafer arrangement 50 includes, as newly designated parts, surfaces 51 and 52 (like surfaces 28 and 29), surface 53 (like surface 34), dishing formation 54 and puddle formation 55.

FIG. 3A shows the next stage (step 3) after that in FIG. 2B (step 2), on subjecting wafer arrangement 40 of FIG. 2B to metal CMP under actual, rather than idealized, conditions. Instead of forming a flat polished top surface 29 on lower insulation layer 22 containing an arrangement of metal lines 26 with a flat polished top surface 28 as in FIG. 2C, wafer arrangement 50 of FIG. 3A has a lower insulation layer 22 with a downwardly concave (dished) topography represented symbolically by dished polished top surface 52 containing an arrangement of metal lines 26 with a recessed polished top surface 51 (step 3).

As a result, as shown in FIG. 3B, on depositing upper insulation layer 30 on dished polished top surface 52 of lower insulation layer 22 (step 4), the objectionable dishing topography is conformally upwardly transferred thereto, producing a like dished top surface, represented symbolically by dished top surface 53, on upper insulation layer 30.

As shown in FIG. 3C, on subjecting upper insulation layer 30 to photolithographic patterning and then etching to form the arrangement of trenches 31 in its dished top surface 53 (step 5), followed by deposition of metal thereon for forming an upper metal layer (not shown) and in turn an arrangement of upper metal lines 32 (step 6), the adverse result is the production of a puddle filled dished topography, represented symbolically by dishing formation 54 filled with a metal puddle formation 55. Puddle formation 55 prevents proper metal CMP of the upper metal layer to produce individual metal lines 32, and instead introduces the probability of adverse metal smearing during the metal CMP and consequent short circuiting between such metal lines (step 7).

Figure 4B:
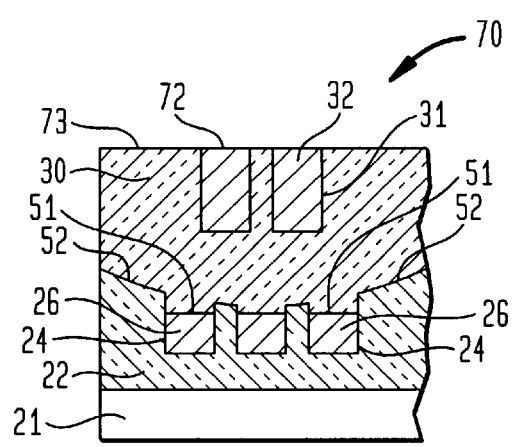

Referring now to FIGS. 4A to 4B, a series of vertical sectional views, like FIGS. 3B to 3C, is shown of stages in forming an actual high pattern factor patterned conductive multilayer, e.g., dual damascene, arrangement, per a modification of said steps (1) to (7), on a semiconductor wafer, designated wafer arrangement 70, per a typical conventional technique. Wafer arrangement 70 has, per FIGS. 4A to 4B, the same parts 21–22, 24, 26, 30–32 and 51–52 as in FIGS. 3B to 3C, plus surfaces 71, 72 and 73.

FIG. 4A shows the next stage (added step 4a) after that in FIG. 3B (step 4), on subjecting dished upper insulation layer 30 of wafer arrangement 50 of FIG. 3B to gross insulation CMP of the bulk of upper insulation layer 30. A flatter preliminarily polished surface 71 per wafer arrangement 70 in FIG. 4A is produced by removing the conformal dishing topography profile at top surface 53 of upper insulation layer 30 in FIG. 3B (added step 4a), formed in conformal relation to the lower insulation layer 22 dishing consequent metal CMP of lower metal layer 25 (step 3).

FIG. 4B shows the resulting product upon photolithographic patterning and then etching to form upper trenches 31 (step 5), followed by deposition of the upper metal layer (not shown) for forming upper metal lines 32 (step 6), and then metal CMP thereof to form a final polished top surface 73 on upper insulation layer 30 containing an arrangement of individual upper metal lines 32 with a polished surface 72 (step 7), thus preventing short circuiting between adjacent upper metal lines.

It is seen that the typical conventional technique of FIGS. 4A to 4B requires an added step (added step 4a) of gross insulation CMP of the bulk of upper insulation layer 30 to remove the transferred conformal dishing profile at its top surface 53 traceable to the dishing at top surface 52 of lower insulation layer 22 caused by metal CMP of the lower metal layer (step 3).

Figure 5A:
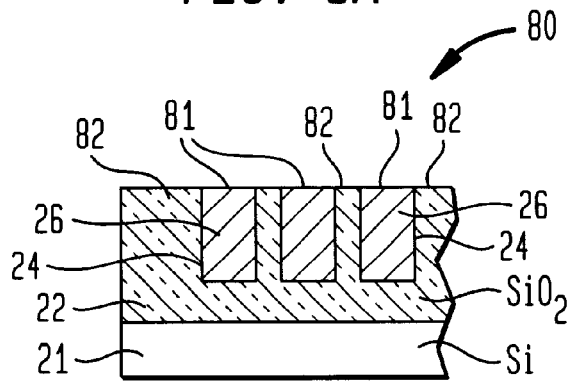
FIGS. 5A to 5C are a series of vertical sectional views, like FIGS. 3A to 3C, but showing stages in forming an actual high pattern factor patterned conductive multilayer arrangement on a semiconductor wafer in accordance with the invention, starting from the stage shown in FIG. 3A to avoid the result shown in FIGS. 3B to 3C.
Figure 5B:
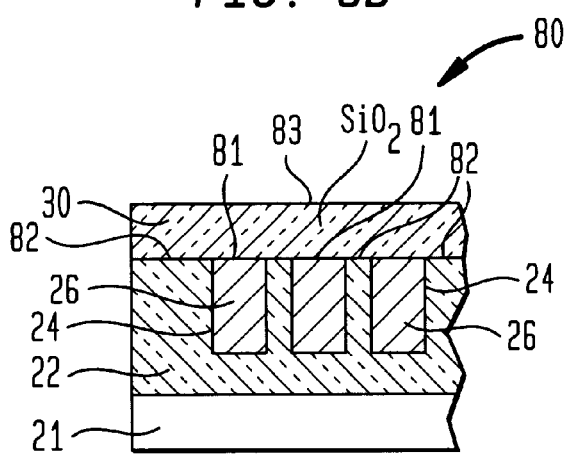
Figure 5C:
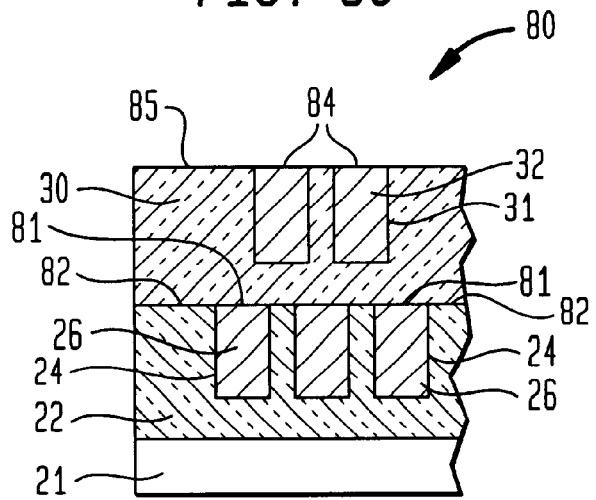

Referring now to FIGS. 5A to 5C, a series of vertical sectional views, like FIGS. 3A to 3C, is shown of stages in forming an actual high pattern factor patterned conductive multilayer, e.g., dual damascene, arrangement, per a different modification of said steps (1) to (7), on a semiconductor wafer, designated wafer arrangement 80, in accordance with the invention, starting from the stage shown in FIG. 3A to avoid the pronounced lower insulation layer 22 dishing result shown in FIGS. 3B to 3C, as well as in FIGS. 4A to 4B. Wafer arrangement 80 has, per FIGS. 5A to 5C, the same parts 21–22, 24, 26 and 30–32 as in FIGS. 3B to 3C, plus surfaces 81, 82, 83, 84 and 85.

FIG. 5A shows the next stage (added step 3a) after that in FIG. 3A (step 3), on subjecting dished lower insulation layer 22 of wafer arrangement 50 of FIG. 3A to selective local insulation CMP, according to the invention. This selective local insulation CMP produces a relatively flat polished lower insulation layer surface 81 containing a like polished metal line surface 82, on a correspondingly reduced thickness lower insulation layer 22, per wafer arrangement 80 in FIG. 5A. It is achieved by selectively removing the local dishing at top surface 52 of lower insulation layer 22 in FIG. 3A resulting from the metal CMP of lower metal layer 25 (cf. FIG. 2B) (step 3).

FIG. 5B shows wafer arrangement 80 after depositing upper insulation layer 30 on flat surface 81 of lower insulation layer 22, such that the top surface 83 of deposited upper insulation layer 30 is likewise relatively flat in conformal relation to flat surface 81 of lower insulation layer 22 (step 4).

FIG. 5C shows the resulting product upon photolithographic patterning and then etching to form upper trenches 31 (step 5); followed by deposition of the upper metal layer (not shown) for providing upper metal lines 32 (step 6); and then metal CMP of the upper metal layer to form a like relatively flat polished top surface 85 on upper insulation layer 30 containing the arrangement of individual upper metal lines 32 with a polished top surface 84, thus preventing short circuiting between adjacent upper metal lines 32 (step 7).

In accordance with the invention, it is seen per FIGS. 5A to 5C that the added step (added step 3a) of selective local insulation CMP of lower insulation layer 22 to remove local dishing at its top surface 53 serves as a low cost step to correct prior art dishing of lower insulation layer 22 (FIG. 3A) consequent metal CMP of lower metal layer 25 (step 3). This avoids transmitting such dishing to upper insulation layer 30 (FIG. 3B) and generation of puddle formation 55 (FIG. 3C).

Moreover, the added step (added step 3a) of selective local insulation CMP according to the invention also serves to reduce the height (thickness) of lower insulation layer 22 in wafer arrangement 80 (FIG. 5A) compared to that in wafer arrangement 50 of the prior art (FIG. 3A) and to that in wafer arrangement 70 of the typical conventional technique (FIG. 4A).

At the same time, the added step (added step 3a) of selective local insulation CMP of wafer arrangement 80 according to the invention also permits reduction of the height (thickness) of upper insulation layer 30 (FIGS. 5B to 5C) compared to that per the prior art (FIGS. 3B to 3C) and to that per the typical conventional technique (FIG. 4A). This is because the flatter topography resulting from the selective local insulation CMP of lower insulation layer 22 (added step 3a) permits deposition of upper insulation layer 30 at a thinner layer thickness, i.e., without concern for an effective conformal bulk covering to offset pronounced topography in lower insulation layer 22 by an adequately thick upper insulation layer 30 (cf. FIGS. 3B and 4A). It is noted that metal CMP of lower metal layer 25 is effected in conventional manner, e.g., using an aqueous colloidal alumina abrasive slurry. On the other hand, in accordance with the invention, the selective local insulation CMP of lower insulation layer 22 is effected in conventional manner, e.g., using an aqueous colloidal silica abrasive slurry. In this case, the silica abrasive slurry is designed to remove insulation material and not metal. Thus, metal is not significantly removed from the metal line regions of the lower arrangement of metal lines (cf. FIG. 5A), yet such metal is eroded to a minor extent, by the selective local insulation CMP.

Figure 6A:
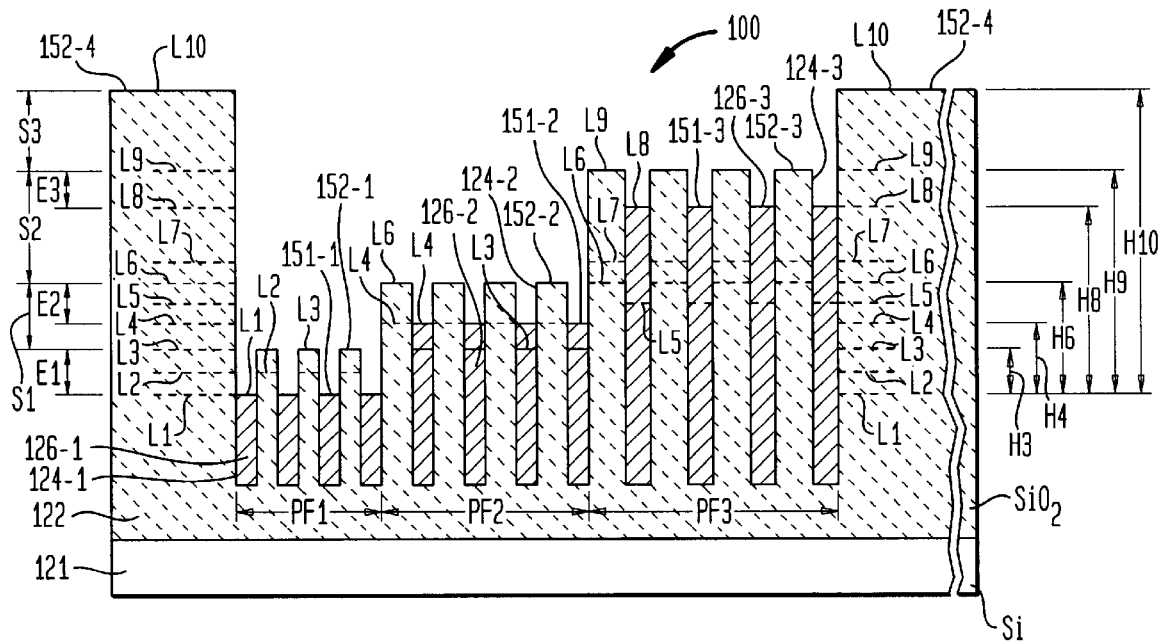
FIGS. 6A and 6B are vertical sectional views, corresponding to FIGS. 3A and 5A, showing before and after stages, respectively, in forming the lowest layer arrangement of an actual high pattern factor patterned conductive multilayer arrangement on a semiconductor wafer in accordance with a particular embodiment of the invention.
Figure 6B:
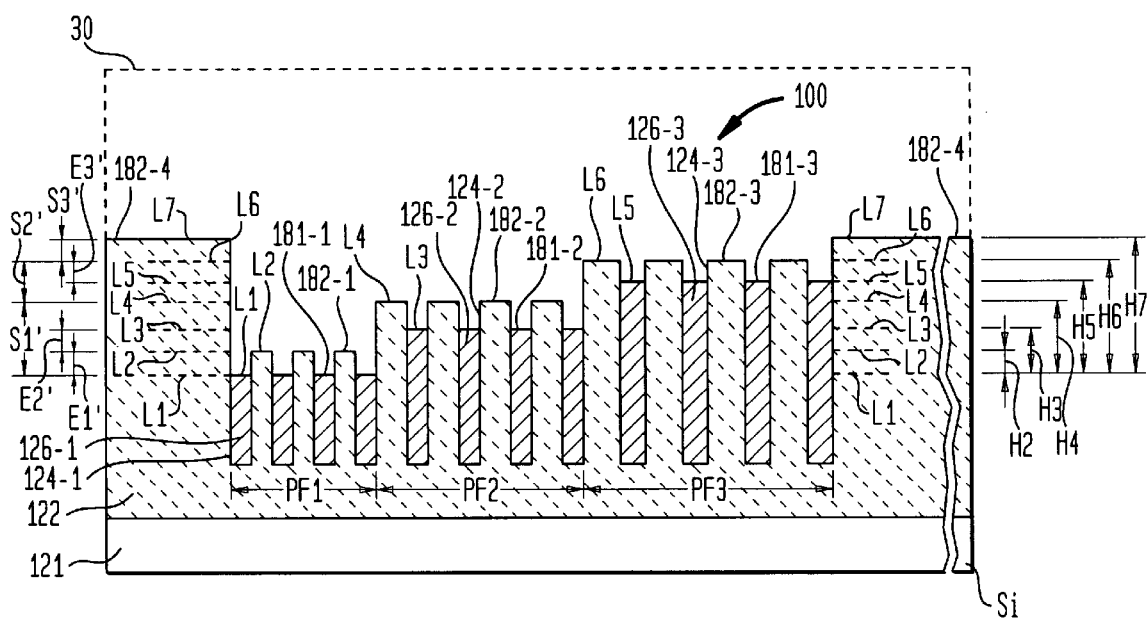

Referring now to FIGS. 6A and 6B, vertical sectional views, corresponding to FIGS. 3A and 5A, are shown depicting before and after stages, respectively, in forming the lowest layer arrangement of an actual high pattern factor patterned conductive multilayer, e.g., dual damascene, arrangement, per said steps (1) to (3), (3a) and (4) to (7), on a semiconductor wafer, designated wafer arrangement 100, in accordance with a particular embodiment of the invention, i.e., starting from the stage shown in FIG. 3A to avoid the result shown in FIGS. 3B to 3C.

Wafer arrangement 100 includes a downwardly stepped, i.e., topography containing, metal chemically mechanically polished arrangement of metal lines in corresponding lower insulation layer trenches having three separate pattern portions with differing high pattern factors, and represents a practical embodiment of a dished lower insulation layer arrangement shown in FIG. 3A.

Wafer arrangement 100 has, per FIG. 6A, parts corresponding to parts 21–22, 24, 26 and 51–52 of FIG. 3A, and designated 121, 122, 124-1, 124-2, 124-3, 126-1, 126-2, 126-3, 151-1, 151-2, 151-3, 152-1, 152-2, 152-3 and 152-4. Wafer arrangement 100 also includes levels L1–L10, heights H3–H4 and H6–H10, steps S1–S3 and erosion spans E1–E3. Levels L1–L10 are at selective individual vertical distances apart.

In the same manner as FIG. 3A, FIG. 6A shows the next stage (step 3) after that in FIG. 2B (step 2), on subjecting wafer arrangement 40 of FIG. 2B to metal CMP, i.e., in the form of wafer arrangement 100, which results in the formation of a downwardly stepped, i.e., non-uniform topography-containing (non-uniformly dished), metal chemically mechanically polished arrangement of metal lines in lower insulation layer trenches with three separate pattern portions of differing high pattern factors.

Wafer arrangement 100, per FIG. 6A, e.g., a wafer of circular disc shape with a diameter of about 8 inches (200 mm), initially includes base layer 121, e.g., of silicon, on which lower insulation layer 122, e.g., of silicon dioxide, is deposited, followed by its photolithographic patterning and then etching to form in its top surface 152-4 an arrangement of three different high pattern factor portion lower trenches 124-1, 124-2 and 124-3 (step 1). The three different high pattern factor portions, designated PF1, PF2 and PF3, e.g., have pattern factor values of 80–90%, 60–70% and 40–60%, respectively.

In turn, per FIG. 6A, the lower metal layer (not shown), e.g., of aluminum, copper or tungsten, is deposited on dished top surface 152-4 of lower insulation layer 122 for filling lower trenches 124-1, 124-2 and 124-3 (step 2), after which the metal layer is subjected to metal CMP for forming an arrangement of three different high pattern factor lower metal lines 126-1, 126-2 and 126-3 in the corresponding lower trenches 124-1, 124-2 and 124-3, thereby providing the three different pattern factor portions PF1, PF2 and PF3 (step 3).

However, as a consequence of such metal CMP, top surface 152-4 of lower insulation layer 122 becomes non-uniformly downwardly stepped (non-uniformly dished) such that the arrangement of three different pattern factor portions PF1, PF2 and PF3 forms an arrangement of three different pattern factor levels or heights at three different step depths relative to the height of top surface 152-4 of lower insulation layer 122.

As noted, pattern factor portion PF1 has a higher pattern factor value, e.g., 80–90% metal and 20–10% insulation material, than that of pattern factor portion PF2, e.g., 60–70%, metal and 40–30% insulation material. In turn, pattern factor portion PF2 has a higher pattern factor value than that of pattern factor portion PF3, e.g., 40–60% metal and 60–40% insulation material. The higher metal content of pattern factor portion PF1 is removed by the metal CMP to a greater extent than that of pattern factor portion PF2, and in turn the higher metal content of pattern factor portion PF2 is removed to a greater extent than that of pattern factor portion PF3.

The metal CMP thus introduces topography due to non-uniform dishing and erosion of metal line regions, which is increasingly pronounced as differing higher pattern factor metal lines are encountered. This is because the metal portion is readily removed by the metal CMP, e.g., using an aqueous colloidal alumina abrasive slurry in conventional manner, but since the slurry is designed to remove metal and not insulation material, the insulation layer portion is not significantly removed, yet it is eroded to a minor extent.

As shown in FIG. 6A, top surface 152-4 of lower insulation layer 122 is at the highest level L10, whereas in pattern factor portion PF1 top surface 151-1 of metal lines 126-1 is at the lowest level L1, while top surface 152-1 of the associated trenches 124-1 is at level L3. In pattern factor portion PF2, top surface 151-2 of metal lines 126-2 is at level L4, while top surface 152-2 of the associated trenches 124-2 is at level L6. In pattern factor portion PF3, top surface 151-3 of metal lines 126-3 is at level L8, while top surface 152-3 of the associated trenches 124-3 is at level L9.

These height differences between the top of the given metal lines and the top of their associated trenches show that, in each of the separate regions corresponding to pattern factor portions PF1, PF2 and PF3, the metal is more readily removed (eroded) by metal CMP than the adjacent insulation layer material. This is represented by erosion span E1 between level L1 at top surface 151-1 of metal lines 126-1 and level L3 at top surface 152-1 of the associated trenches 124-1; by erosion span E2 between level L4 at top surface 151-2 of metal lines 126-2 and level L6 at top surface 152-2 of the associated trenches 124-2; and by erosion span E3 between level L8 at top surface 151-3 of metal lines 126-3 and level L9 at top surface 152-3 of the associated trenches 124-3.

A level difference or height H3 exists between top surface 151-1 at level L1 of lowest metal lines 126-1 and top surface 152-1 at level L3 of the associated trenches 124-1 of pattern factor portion PF1.

A level difference or height H4 exists between top surface 151-1 at level L1 of lowest metal lines 126-1 and top surface 151-2 at level L4 of metal lines 126-2 of pattern factor portion PF2. A level difference or height H6 exists between top surface 151-1 at level L1 of lowest metal lines 126-1 and top surface 152-2 at level L6 of trenches 124-2 of pattern factor portion PF2.

A level difference or height H8 exists between top surface 151-1 at level L1 of lowest metal lines 126-1 and top surface 151-3 at level L8 of metal lines 126-3 of pattern factor portion PF3. A level difference or height H9 exists between top surface 151-1 at level L1 of lowest metal lines 126-1 and top surface 152-3 at level L9 of trenches 124-3 of pattern factor portion PF3.

Finally, a level difference or height H10 exists between top surface 151-1 at level L1 of lowest metal lines 126-1 and top surface 152-4 at level L10 of lower insulation layer 122.

Top surface 152-1 at level L3 of trenches 124-1 of pattern factor portion PF1 is at a step depth S1 relative to top surface 152-2 at level L6 of trenches 124-2 of pattern factor portion PF2. Top surface 152-2 at level L6 of trenches 124-2 of pattern factor portion PF2 is at a step depth S2 relative to top surface 152-3 at level L9 of trenches 124-3 of pattern factor portion PF3. Top surface 152-3 at level L9 of trenches 124-3 of pattern factor portion PF3 is at a step depth S3 relative to top surface 152-4 at level L10 of lower insulation layer 122.

Per FIG. 6A, the enhanced removal or erosion of the largest metal pattern factor region compared to the smallest metal pattern factor region is depicted by pattern factor portion PF1 compared to pattern factor portion PF3, with pattern factor portion PF2 depicting an intermediate removal or erosion degree per an intermediate metal pattern factor region. This enhanced metal content removal or erosion is caused by metal CMP of an arrangement of differing metal pattern factor regions, e.g., damascene (inlaid) metal lines, as earlier noted.

By way of example, after step (3), the step depth of pattern factor portion PF1 relative to insulation layer surface 152-4 is about 125–250 nm (the sum of step depths S1. S2 and S3; i.e., height H10 minus height H3). In turn, the step depth of pattern factor portion PF2 relative to insulation layer surface 152-4 is about 100–200 nm (the sum of step depths S2 and S3; i.e., height H10 minus height H6). Also, the step depth of pattern factor portion PF3 relative to insulation layer surface 152-4 is about 25–75 nm (step depth S3; i.e., height H10 minus height H9).

The step depths of pattern factor portions PF1, PF2 and PF3, per the topography illustrated in FIG. 6A, depict the pronounced amount of overall dishing in top surface 152-4 of lower insulation layer 122 as well as the differences in dishing amounts as among pattern factor portions PF1, PF2 and PF3, which occur in wafer arrangement 100 as a result of the metal CMP of lower insulation layer 122 (step 3).

Referring now to FIG. 6B, which corresponds to FIG. 5A, the next stage (added step 3a) after that in FIG. 6A (step 3) is shown, i.e., on subjecting non-uniformly dished lower insulation layer 122 of wafer arrangement 100 of FIG. 6A to selective local insulation CMP in accordance with the invention.

Wafer arrangement 100 has, per FIG. 6B, parts corresponding to parts 21-22, 24, 26, 81 and 82 of FIG. 5A, and designated 121, 122, 124-1, 124-2, 124-3, 126-1, 126-2 and 126-3 (like FIG. 6A), plus 181-1, 181-2, 181-3, 182-1, 182-2, 182-3 and 182-4 (akin to parts 151-1 to 151-3 and 152-1 to 152-4 of FIG. 6A). Wafer arrangement 100 also includes, akin to FIG. 6A, levels L1–L7 at selective individual vertical distances apart, as aforesaid, plus heights H2–H7, steps S1'–S3' and erosion spans E1'–E3'.

In the same manner as in FIG. 5A, FIG. 6B shows that consequent the selective local insulation CMP of the dished insulation layer 122 (added step 3a) according to the invention, a relatively flat polished lower insulation layer top surface 182-4 is formed in wafer arrangement 100, containing pattern factor portions PF1, PF2 and PF3 with lower trenches 124-1, 124-2 and 124-3 having polished top surfaces 182-1, 182-2 and 182-3, and associated metal lines 126-1, 126-2 and 126-3 having polished top surfaces 181-1, 181-2 and 181-3.

Thus, the dishing at top surface 152-4 of lower insulation layer 122 in wafer arrangement 100 resulting from metal CMP of the lower metal layer (not shown) per FIG. 6A (step 3), is removed per FIG. 6B (added step 3a) according to the invention.

As pattern factor portion PF1 has a higher pattern factor value, e.g., 80–90% metal and 20–10% insulation material, its low insulation material content is only removed or eroded to a minor extent by the selective local insulation CMP. Also, as pattern factor portion PF2 has an intermediate pattern factor value, e.g., 60–70%, metal and 40–30% insulation material, its intermediate insulation material content is not removed or eroded to a significant extent by the selective local insulation CMP. Similarly, as pattern factor portion PF3 has a lower pattern factor value, e.g., 40–60% metal and 60–40% insulation material, its higher insulation material content is removed or eroded to a more significant extent by the selective local insulation CMP.

On the other hand, as lower insulation layer 122 contains only insulation material, it is removed or eroded to a great extent by the selective local insulation CMP (added step 3a). The aqueous colloidal silica abrasive slurry contemplated is designed to remove or erode insulation material, e.g., silicon dioxide, and not metal, and in fact removes or erodes insulation material more rapidly than it removes or erodes metal.

In contrast thereto, the earlier metal CMP step (step 3) introduces topography due to non-uniform dishing and erosion of metal line regions, which is increasingly pronounced as higher pattern factor metal lines are encountered. This is because metal, e.g., aluminum, is readily removed or eroded by metal CMP, e.g., using an aqueous colloidal alumina abrasive slurry, i.e., metal is more rapidly removed or eroded than insulation material during metal CMP.

Thus, as shown in FIG. 6B, top surface 152-4 of lower insulation layer 122 is reduced or eroded from the highest level L10 (FIG. 6A) to the much lower level L7 as polished top surface 182-4 (FIG. 6B). In pattern factor portion PF1 the polished top surface 181-1 of metal lines 126-1 remains more or less at the lowest level L1, while the polished top surface 182-1 of the associated trenches 124-1 is reduced or eroded from level L3 to level L2. In pattern factor portion PF2, the polished top surface 181-2 of metal lines 126-2 is reduced or eroded from level L4 to level L3, while the polished top surface 182-2 of the associated trenches 124-2 is reduced or eroded from level L6 to level L4. In pattern factor portion PF3, the polished top surface 181-3 of metal lines 126-3 is reduced or eroded from level L8 to level L5, while the polished top surface 182-3 of the associated trenches 124-3 is reduced or eroded from level L9 to level L6.

These height differences between the top of the given metal lines and the top of their associated trenches show that, in each of the separate regions corresponding to pattern factor portions PF1, PF2 and PF3, the insulation material is more readily, i.e., more rapidly, removed or eroded by the selective local insulation CMP than the adjacent metal. This is represented by erosion span E1' between level L1 at polished top surface 181-1 of metal lines 126-1 and level L2 at polished top surface 182-1 of the associated trenches 124-1; by erosion span E2' between level L3 at polished top surface 181-2 of metal lines 126-2 and level L4 at polished top surface 182-2 of the associated trenches 124-2; and by erosion span E3' between level L5 at polished top surface 181-3 of metal lines 126-3 and level L6 at polished top surface 182-3 of the associated trenches 124-3. Erosion spans E1' to E3' are clearly shorter than erosion spans E1 to E3.

Per FIG. 6B, it is seen that a level difference or height H2 exists between polished top surface 181-1 at level Li of lowest metal lines 126-1 and polished top surface 182-1 at level L2 of the associated trenches 124-1 of pattern factor portion PF1.

A level difference or height H3 exists between polished top surface 181-1 at level L1 of lowest metal lines 126-1 and polished top surface 181-2 at level L3 of metal lines 126-2 of pattern factor portion PF2. A level difference or height H4 exists between polished top surface 181-1 at level L1 of lowest metal lines 126-1 and polished top surface 182-2 at level L4 of the associated trenches 124-2 of pattern factor portion PF2. A level difference or height H5 exists between polished top surface 181-1 at level L1 of lowest metal lines 126-1 and polished top surface 181-3 at level L5 of metal lines 126-3 of pattern factor portion PF3. A level difference or height H6 exists between the polished top surface 151-1 at level L1 of lowest metal lines 126-1 and polished top surface 182-3 at level L6 of trenches 124-3 of pattern factor portion PF3.

Finally, a level difference or height H7 exists between polished top surface 181-1 at level L1 of lowest metal lines 126-1 and polished top surface 182-4 at level L7 of lower insulation layer 122.

Polished top surface 182-1 at level L2 of trenches 124-1 of pattern factor portion PF1 is at a step depth S1' relative to polished top surface 182-2 at level L4 of trenches 124-2 of pattern factor portion PF2. Polished top surface 182-2 at level L4 of trenches 124-2 of pattern factor portion PF2 is at a step depth S2' relative to polished top surface 182-3 at level L6 of trenches 124-3 of pattern factor portion PF3. Polished top surface 182-3 at level L6 of trenches 124-3 of pattern factor portion PF3 is at a step depth S3' relative to polished top surface 182-4 at level L7 of lower insulation layer 122. Step depths S1' to S3' are clearly shorter than step depths S1 to S3.

By way of corresponding example, the step depth of pattern factor portion PF1 relative to insulation layer surface 182-4 is about 50–75 nm (the sum of step depths S1', S2' and S3'; i.e., height H7 minus height H2). In turn, the step depth of pattern factor portion PF2 relative to insulation layer surface 182-4 is about 40–90 nm (the sum of step depths S2' and S3'; i.e., height H7 minus height H4). Also, the step depth of pattern factor portion PF3 relative to insulation layer surface 182-4 is about 10–25 nm (step depth S3'; i.e., height H7 minus height H6).

After selective local insulation CMP of lower insulation layer 122 (added step 3a). according to the invention, wafer arrangement 100 is subjected to subsequent steps as contemplated by FIGS. 5B to 5C (steps 4 to 7).

Thus, per FIG. 5B, an upper insulation layer 30 is deposited on relatively flat surface 82 of lower insulation layer 22 of wafer arrangement 80 (corresponding to polished surface 182-4 of lower insulation layer 122 of wafer arrangement 100 per FIG. 6B, in which upper insulation layer 30 is shown in dashed line), such that the top surface 83 of upper insulation layer 30 is relatively flat in conformity with flat surface 82 of lower insulation layer 22 (step 4). Then, per FIG. 5C, wafer arrangement 80 is subjected to photolithographic patterning and then etching to form upper trenches 31 (step 5), followed by deposition of the upper metal layer (not shown) for providing upper metal lines 32 (step 6), and then metal CMP of the upper metal layer to form a polished top surface 85 of upper insulation layer 30 containing the arrangement of individual upper metal lines 32 with a polished top surface 84, thus preventing short circuiting between adjacent upper metal lines 32 (step 7).

In accordance with the invention, it is seen per FIGS. 5A to 5C and 6B that the added step (added step 3a) of selective local insulation CMP of lower insulation layer 22 serves as a low cost step to correct prior art dishing of lower insulation layer 22 (FIGS. 3A and 6A) consequent metal CMP of lower metal layer 25 (step 3), and which avoids transmitting such dishing conformally to upper insulation layer 30 (FIG. 3B) and consequent generation of puddle formation 55 (FIG. 3C).

Moreover, the added step (added step 3a) of selective local insulation CMP according to the invention serves to reduce the height of lower insulation layer 22 in wafer arrangement 80 per FIG. 5A (and of insulation layer 122 in wafer arrangement 100 per FIG. 6B) compared to wafer arrangement 50 of the prior art (FIG. 3A) and to wafer arrangement 70 of the typical conventional technique (FIG. 4A). At the same time, such added step (added step 3a) of selective local insulation CMP of the wafer arrangement 80 per FIGS. 5A to 5C (and of wafer arrangement 100 per FIG. 6B) of the invention also permits a reduction of the height (thickness) of upper insulation layer 30 (FIGS. 5B to 5C) compared to that per the prior art (FIGS. 3B to 3C) and to that per the typical conventional technique (FIG. 4A).

Figure 7A:
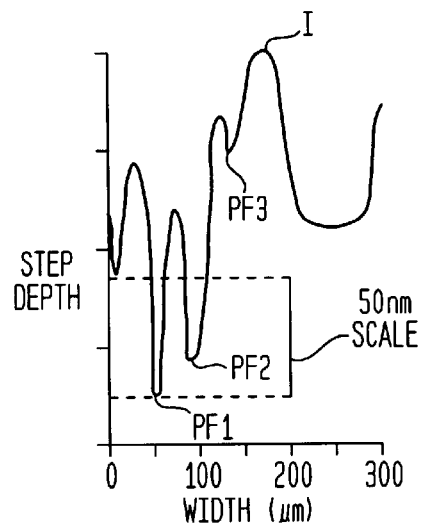
FIGS. 7A and 7B are graphs, with curves corresponding to the topography profiles shown in FIGS. 6A and 6B, indicating the relative step depths per a 50 nm scale (ordinate) of three pattern portions extending along the width in microns (abscissa), of the lower insulation layer of an actual semiconductor wafer before and after, respectively, the insulation CMP step in accordance with the invention.
Figure 7B:
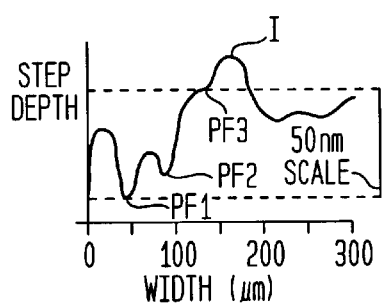

Referring now to FIGS. 7A and 7B, graphs are shown, with actual data based curves corresponding to the topography profiles depicted in FIGS. 6A and 6B, indicating the relative step depths, with respect to the top surface I of the lower insulation layer 122, per a 50 nm scale (ordinate) of the three pattern factor portions PF1, PF2 and PF3, extending along the width in microns (abscissa), of an actual semiconductor wafer arrangement 100 before and after, respectively, the selective local insulation CMP step (added step 3a) according to the invention. In this case, the lower insulation layer is composed of silicon dioxide and the lower metal layer is composed of aluminum.

FIG. 7A, which corresponds to FIG. 6A, shows that before the post-metal selective local insulation CMP according to the invention (added step 3a). a marked difference in height exists between the top surface I of the lower insulation layer and the top surfaces of the arrangements of metal lines in the three pattern factor portions PF1, PF2 and PF3. Pattern factor portion PF3 is at a small step depth (S3; height H10 minus height H9), pattern factor portion PF2 is at an intermediate step depth (S2+S3; height H10 minus height H6), and pattern factor portion PF1 is at a large step depth (S1+S2+S3; height H10 minus height H3), i.e., relative to top surface I of the lower insulation layer.

Thus, the non-uniform topography introduced by the lower metal CMP (step 3) is largest for pattern factor portion PF1, intermediate for pattern factor portion PF2 and smallest for pattern factor PF3, Also, per FIG. 7A, pattern factor portions PF1, PF2 and PF3 are at relatively large differential step depths to each other (S1, S2 and S3, respectively).

FIG. 7B, which corresponds to FIG. 6B, shows that after the post-metal selective local insulation CMP according to the invention (added step 3a), there is a marked reduction in the difference in height between the polished top surface I of the lower insulation layer and the polished top surfaces of the metal lines in the three pattern factor portions PF1, PF2 and PF3. Pattern factor portion PF3 is at a shallow step depth (S3', height H7 minus H6), pattern factor portion PF2 is at a slight step depth (S3'+S2'; height H7 minus height H4), and pattern factor portion PF1 is at a small step depth (S3'+S2'+S1'; height H7 minus height H2), i.e., relative to top surface I of the lower insulation layer.

Also, pattern factor portions PF1, PF2 and PF3 are at relatively small differential step depths to each other (S1', S2' and S3', respectively).

The post-metal CMP selective local insulation CMP step (added step 3a) per the invention used to planarize the lower insulation layer to provide the results shown in FIG. 7B, compared to FIG. 7A, was effected on a semiconductor wafer corresponding to wafer arrangement 100 of circular disc shape with a diameter of about 8 inches (200 mm), formed of silicon as base layer with a lower insulation layer of silicon dioxide and a lower metal layer of aluminum.

In the particular planarizing test run (added step 3a), a wafer carrier, on which the post-metal CMP wafer arrangement (per FIG. 6A and 7A) was affixed, was rotated at 100 rpm at a polishing pressure downforce of 4 psi against a soft polishing pad (designated soft pad P-C) affixed to a platen also rotated at 100 rpm, under the application of a colloidal silica abrasive slurry at a slurry flow rate of 150 sccm (standard cubic centimeters per minute), per conventional polishing apparatus and technique, to form the insulation CMP wafer arrangement of the invention (per FIGS. 6B and 7B).

Similar planarizing test runs were earlier effected using an intermediate hardness polishing pad (designated intermediate hardness pad P-B) and a hard polishing pad (designated hard pad P-A), i.e., an IC 1000 pad; Rodel Inc., Del., in place of soft pad P-C.

Specifically, in initial runs, use of hard pad P-A led to desired planarizing of the lower insulation layer but caused some metal smearing of metal in the arrangement of metal lines which resulted in a product yield loss due to shorts between such metal lines, e.g., of about 75% of the corresponding yield loss of the wafer arrangement as polished by the metal CMP step (step 3) per FIGS. 6A and 7A. Further runs then were effected with intermediate hardness pad P-B, i.e., a softer pad than hard pad P-A, and this avoided substantially such metal smearing result. Still further runs were also effected with soft pad P-C, i.e., a softer pad than intermediate hardness pad P-B, which avoided completely such metal smearing result.

As to sheet resistance results, distribution of data points of pertinent runs showed that use of soft pad P-C leads to metal line arrangements of similar desired sheet resistance values, whereas use of intermediate hardness pad P-B and of hard pad P-A leads to metal line arrangements of more widely varying sheet resistance values. Thus, while use of hard pad P-A is effective for attaining selective local insulation CMP of wafer arrangement 100 according to the invention, use of intermediate hardness pad P-B is more effective for this purpose, while use of soft pad P-C is most effective therefor. Hence, softer gradations of the platen polishing pad than hard pad P-A, i.e., an IC 1000 pad; Rodel Inc., Del., are preferred such as an intermediate hardness pad P-B, and more especially an even softer pad such as soft pad P-C. Thus, soft pad P-C corresponds to a pad capable of changing the topography profile from that shown in FIG. 7A to that shown in FIG. 7B for a semiconductor wafer of the type contemplated by wafer arrangement 100 of FIG. 6A for forming the modified wafer arrangement of the type shown in FIG. 6B.

The selective local insulation CMP is typically effected at a wafer carrier rotation of 100 rpm, a wafer polishing pressure downforce of 4 psi against the platen polishing pad, a platen rotation of 100 rpm, under the application of a colloidal silica abrasive slurry at a 150 sccm slurry flow rate.

Figure 8:
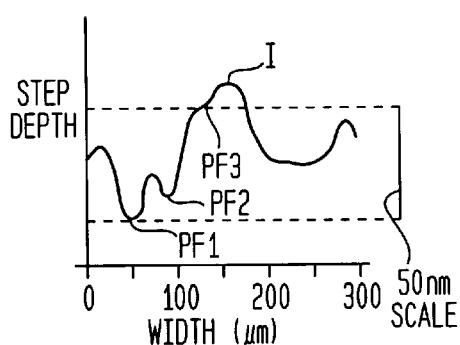
FIG. 8 is a graph, like those of FIGS. 7A and 7B, but showing the relative step depths per a 50 nm scale (ordinate)

Referring to FIG. 8, a graph is shown, similar to those of FIGS. 7A and 7B, with actual data based curves corresponding to the upwardly transferred conformal topography profile depicted in FIG. 4A. This profile corresponds to the relative step depths of the three pattern portions PF1, PF2 and PF3, with respect to the top surface I of the upper insulation layer rather than the lower insulation layer, per a 50 nm scale (ordinate), i.e., extending along the width in microns (abscissa), of an actual semiconductor wafer arrangement 70 produced by the typical conventional technique shown in FIG. 4A.

The typical conventional technique results in a topographic profile after gross insulation CMP of the bulk of the upper insulation layer per FIG. 8 similar to the topographic profile after selective local insulation CMP of the lower insulation layer according to the invention per FIG. 7B. However, unlike the invention (cf. FIGS. 5B to 5C), the typical conventional technique requires the deposition of an extra thick conformal upper insulation layer per FIG. 3B and its costly preliminary gross CMP per FIG. 4A to attain the profile shown in FIG. 8, prior to further processing of the upper insulation layer to provide the wafer arrangement shown in FIG. 4B.

Specifically, per the typical conventional technique, the steps of depositing an extra thick conformal upper insulation layer, and of gross insulation CMP of the bulk of the upper insulation layer, require extra time, extra steps, and extra materials, e.g., insulation material for the extra thick upper insulation layer and consumables including abrasive slurry and polishing pads, leading to higher processing costs.

More important, the typical conventional technique does not minimize the height differences of the metal pattern factor portions in the lower insulation layer relative to the lower insulation layer top surface and relative to each other, in the manner of the invention.

The invention adds a comparatively low cost selective local insulation CMP step (added step 3a) which is applied to the lower insulation layer, which is effected right after the usual metal CMP step (step 3), and which provides two significant benefits: (i) it reduces the topography height differences between lower insulation layer areas and associated metal lines, and (ii) it reduces the topography difference between the associated metal lines having different pattern factors. This leads to a more planar insulation layer that allows for wider process windows and higher yielding processing (lower yield losses) at subsequent (higher) levels on the semiconductor wafer.

The more planar topographic arrangement of the semiconductor wafer of the invention minimizes the thickness of the lower insulation layer (FIGS. 5A and 6B) and also of the upper insulation layer (FIGS. 5B to 5C; see, also, upper insulation layer 30 in FIG. 6B), and thus minimizes in turn the thickness of the wafer arrangement. This minimizes depth of focus problems during photolithographic processing. The smaller thickness of the wafer arrangement permitted per the invention also minimizes difficulties in residue removal consequent the selective local insulation CMP processing of the lower insulation layer, compared to the extensive residue which must be removed consequent the gross insulation CMP processing of the relatively thick upper insulation layer per the typical conventional technique.

The invention achieves desired post-metal CMP planarization by way of a simpler overall process flow and lower cost than in the case of the typical conventional technique. Moreover, the invention avoids shorting of adjacent metal lines at upper level local puddles caused by lower level erosion and dishing. Due to the use of selectively soft polishing pads as compared to relatively hard polishing pads, the invention also avoids shorting of adjacent metal lines otherwise caused by lower level metal line smearing during selective local insulation CMP of the lower insulation layer. It also inherently avoids shorting between lower level metal lines and upper level metal lines. The invention thus minimizes product yield loss and also achieves consistent sheet resistance values for the metal lines in the lower and upper metal line arrangements.

Accordingly, it can be appreciated that the specific embodiments described are merely illustrative of the general principles of the invention. Various modifications may be provided consistent with the principles set forth.

What is claimed is:

1. A process for planarization of an insulation layer disposed on a semiconductor wafer and having a surface containing a downwardly stepped chemically mechanically polished arrangement of metal lines in corresponding trenches defined in the insulation layer between intervening insulation portions;

including a first pattern portion of metal lines separated by intervening insulation portions and defining a first pattern factor having a first value, and an adjacent second pattern portion of metal lines separated by intervening insulation portions and defining a second pattern factor having a second value different from the first value;

the second pattern portion being located at a step depth relative to the insulation layer surface different from the step depth of the first pattern portion relative to said layer surface;

the process comprising chemically mechanically polishing the insulation layer surface and the first and second pattern portions sufficiently to reduce the step depths of the first and second pattern portions relative to the insulation layer surface and relative to each other, for planarization of the insulation layer surface and first and second pattern portions relative to each other.

2. The process of claim 1 wherein the wafer comprises silicon, the insulation layer comprises silicon dioxide, and the metal lines individually consist of a member selected from the group consisting of aluminum, copper, and tungsten.

3. The process of claim 1 wherein the value of the first pattern factor is about 80–90% and the value of the second pattern factor is about 60–70%.

4. The process of claim 1 further comprising depositing a further insulation layer on the resulting planarized insulation layer surface and first and second pattern portions, providing a further arrangement of metal lines in corresponding trenches in the further insulation layer, and chemically mechanically polishing the further arrangement of metal lines.

5. The process of claim 4 wherein the wafer comprises silicon, the first-mentioned insulation layer and further insulation layer comprise silicon dioxide, and the metal lines individually consist of a member selected from the group consisting of aluminum, copper, and tungsten.

6. A process for planarization of an insulation layer disposed on a semiconductor wafer and having a surface containing a downwardly stepped chemically mechanically polished arrangement of metal lines in corresponding trenches defined in the insulation layer between intervening insulation portions;

including a first pattern portion of metal lines separated by intervening insulation portions and defining a first pattern factor having a first value, an adjacent second pattern portion of metal lines separated by intervening insulation portions and defining a second pattern factor having a second value different from the first value, and an adjacent third pattern portion of metal lines separated by intervening insulation portions and defining a third pattern factor having a third value different from the first and second values;

the second pattern portion being located at a step depth relative to the insulation layer surface different from the step depth of the first pattern portion relative to said layer surface, and the third pattern portion being located at a step depth relative to the insulation layer surface different from the step depths of the first and second pattern portions relative to said layer surface;

the process comprising chemically mechanically polishing the insulation layer surface and the first, second and third pattern portions sufficiently to reduce the step depths of the first, second and third pattern portions relative to the insulation layer surface and relative to each other, for planarization of the insulation layer surface and first, second and third pattern portions relative to each other.

7. The process of claim 6 wherein the wafer comprises silicon, the insulation layer comprises silicon dioxide, and the metal lines individually consist of a member selected from the group consisting of aluminum, copper, and tungsten.

8. The process of claim 6 wherein the value of the first pattern factor is about 80–90%, the value of the second pattern factor is about 60–70%, and the value of the third pattern factor is about 40–60%.

9. The process of claim 6 wherein, before the chemical mechanical polishing, the step depth of the first pattern portion relative to the insulation layer surface is about 125–250 nm, the step depth of the second pattern portion relative to said layer surface is about 100–200 nm, and the step depth of the third pattern portion relative to said layer surface is about 25–75 nm, and after the chemical mechanical polishing, the step depth of the first pattern portion relative to said layer surface is about 50–75 nm, the step depth of the second pattern portion relative to said layer surface is about 40–90 nm, and the step depth of the third pattern portion relative to said layer surface is about 10–25 nm.

10. The process of claim 6 further comprising depositing a further insulation layer on the resulting planarized insulation layer surface and first, second and third pattern portions, providing a further arrangement of metal lines in corresponding trenches in the further insulation layer, and chemically mechanically polishing the further arrangement of metal lines.

11. The process of claim 10 wherein the wafer comprises silicon, the first-mentioned insulation layer and further insulation layer comprise silicon dioxide, and the metal lines individually consist of a member selected from the group consisting of aluminum, copper, and tungsten.

12. A process for planarization of an insulation layer disposed on a semiconductor wafer and having a surface containing a downwardly stepped chemically mechanically polished arrangement of metal lines in corresponding trenches defined in the insulation layer between intervening insulation portions;

including a first pattern portion of metal lines separated by intervening insulation portions and defining a first pattern factor having a first value, an adjacent second pattern portion of metal lines separated by intervening insulation portions and defining a second pattern factor having a second value smaller than the first value, and an adjacent third pattern portion of metal lines separated by intervening insulation portions and defining a third pattern factor having a third value smaller than the second value;

the second pattern portion being located at a step depth relative to the insulation layer surface smaller than the step depth of the first pattern portion relative to said layer surface, and the third pattern portion being located at a step depth relative to said layer surface smaller than the step depth of the second pattern portion relative to said layer surface;

the process comprising chemically mechanically polishing the insulation layer surface and the first, second and third pattern portions sufficiently to reduce the step depths of the first, second and third pattern portions relative to the insulation layer surface and relative to each other, for planarization of the insulation layer surface and first, second and third pattern portions relative to each other.

13. The process of claim 12 wherein the wafer comprises silicon, the insulation layer comprises silicon dioxide, and the metal lines individually consist of a member selected from the group consisting of aluminum, copper, and tungsten.

14. The process of claim 12 wherein the value of the first pattern factor is about 80–90%, the value of the second pattern factor is about 60–70%, and the value of the third pattern factor is about 40–60%.

15. The process of claim 12 wherein, before the chemical mechanical polishing, the step depth of the first pattern portion relative to the insulation layer surface is about 125–250 nm, the step depth of the second pattern portion relative to said layer surface is about 100–200 nm, and the step depth of the third pattern portion relative to said layer surface is about 25–75 nm, and after the chemical mechanical polishing, the step depth of the first pattern portion relative to said layer surface is about 50–75 nm, the step depth of the second pattern portion relative to said layer surface is about 40–90 nm, and the step depth of the third pattern portion relative to said layer surface is about 10–25 nm.

16. The process of claim 12 further comprising depositing a further insulation layer on the resulting planarized insulation layer surface and first, second and third pattern portions, providing a further arrangement of metal lines in corresponding trenches in the further insulation layer, and chemically mechanically polishing the further arrangement of metal lines.

17. The process of claim 16 wherein the wafer comprises silicon, the first-mentioned insulation layer and further insulation layer comprise silicon dioxide, and the metal lines individually consist of a member selected from the group consisting of aluminum, copper, and tungsten.

* * * * *